US012356561B2

(12) United States Patent
Song et al.

(10) Patent No.: US 12,356,561 B2
(45) Date of Patent: Jul. 8, 2025

(54) ELECTRONIC CONTROL DEVICE

(71) Applicant: LG INNOTEK CO., LTD., Seoul (KR)

(72) Inventors: Kun Yong Song, Seoul (KR); Dong Joon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 212 days.

(21) Appl. No.: 18/254,328

(22) PCT Filed: Nov. 24, 2021

(86) PCT No.: PCT/KR2021/017420
§ 371 (c)(1),
(2) Date: May 24, 2023

(87) PCT Pub. No.: WO2022/124649
PCT Pub. Date: Jun. 16, 2022

(65) Prior Publication Data
US 2024/0107687 A1    Mar. 28, 2024

(30) Foreign Application Priority Data

Dec. 10, 2020  (KR) ........................ 10-2020-0172219
Dec. 15, 2020  (KR) ........................ 10-2020-0175807

(51) Int. Cl.
*H05K 5/00*    (2025.01)
*H05K 1/02*    (2006.01)
(Continued)

(52) U.S. Cl.
CPC ........... *H05K 5/003* (2013.01); *H05K 1/0233* (2013.01); *H05K 1/145* (2013.01); *H05K 5/0247* (2013.01);
(Continued)

(58) Field of Classification Search
CPC .... H05K 5/003; H05K 5/0247; H05K 1/0233; H05K 1/145; H05K 2201/10303; H05K 2201/10409
(Continued)

(56) References Cited

U.S. PATENT DOCUMENTS

2001/0051098 A1* 12/2001 Kenney ................. F04C 15/008
                                                                  417/410.1
2012/0104886 A1*  5/2012 Yamasaki ............ B62D 5/0406
                                                                  310/71

(Continued)

FOREIGN PATENT DOCUMENTS

JP    2018207641 A  * 12/2018  ............. H02K 11/33
JP    2020-141499 A    9/2020
(Continued)

OTHER PUBLICATIONS

International Search Report dated Mar. 3, 2022 in International Application No. PCT/KR2021/017420.

*Primary Examiner* — Zhengfu J Feng
(74) *Attorney, Agent, or Firm* — SALIWANCHIK, LLOYD & EISENSCHENK

(57) ABSTRACT

The electronic control device includes: a housing; a first plate disposed in the housing; a second plate disposed in the housing and having an inner surface facing the inner surface of the first plate; a first control module disposed in the housing; and a second control module disposed in the housing, wherein the first control module includes: a first printed circuit board having an inner surface coupled to one side of the first plate and one side of the second plate; a first power supply substrate disposed on an outer surface of the second plate; and a first EMI filter disposed between the first plate and the second plate, an inner surface of which is opposite to an inner surface of the first printed circuit board, and wherein the second control module includes: a second (Continued)

printed circuit board having an inner surface coupled to the other side surface of the first plate and the other side surface of the second plate; a second power supply substrate disposed on an outer surface of the first plate; and a second EMI filter disposed between the first plate and the second plate, an inner surface thereof faces an inner surface of the second printed circuit board.

20 Claims, 11 Drawing Sheets

(51) Int. Cl.
  *H05K 1/14* (2006.01)
  *H05K 5/02* (2006.01)
(52) U.S. Cl.
  CPC .............. *H05K 2201/10303* (2013.01); *H05K 2201/10409* (2013.01)

(58) Field of Classification Search
  USPC ......................................................... 361/752
  See application file for complete search history.

(56) References Cited

U.S. PATENT DOCUMENTS

| | | | |
|---|---|---|---|
| 2014/0265749 A1* | 9/2014 | Motoda | H02K 11/30 310/68 R |
| 2014/0339966 A1* | 11/2014 | Tomizawa | H02K 11/33 310/68 D |
| 2016/0254732 A1 | 9/2016 | Kojima et al. | |
| 2018/0178829 A1* | 6/2018 | Fujimoto | H02K 11/215 |
| 2019/0207488 A1* | 7/2019 | Ichikawa | H02K 5/10 |
| 2022/0278594 A1* | 9/2022 | Nakano | H05K 3/36 |

FOREIGN PATENT DOCUMENTS

| | | |
|---|---|---|
| KR | 10-1429499 B1 | 8/2014 |
| KR | 10-2019-0130839 A | 11/2019 |

* cited by examiner

ELECTRONIC CONTROL DEVICE

CROSS-REFERENCE TO RELATED APPLICATIONS

This application is the U.S. national stage application of International Patent Application No. PCT/KR2021/017420, filed Nov. 24, 2021, which claims the benefit under 35 U.S.C. § 119 of Korean Application Nos. 10-2020-0172219, filed Dec. 10, 2020; and 10-2020-0175807, filed Dec. 15, 2020; the disclosures of each of which are incorporated herein by reference in their entirety.

DESCRIPTION OF INVENTION

Technical Field

The present embodiment relates to an electronic control device.

Background Art

As electric devices of automobiles, engine electric devices (starting device, ignition device, and charging device) and lighting device are common, but in recent years, as vehicles are more electronically controlled, most systems including chassis electric devices are becoming electric and electronic.

In general, an electronic control device is an electronic control device that variously controls the internal operation of a vehicle, and there are largely two types of ECUs that operate when the vehicle is in an OFF state and an ECU that does not operate when the vehicle is in an OFF state.

The electronic control device is connected to the motor, and can control the operation of the vehicle through the control of the motor. Although many electronic components are disposed inside the electronic control device, it is difficult to arrange the electronic components in consideration of the narrow space in the housing.

DETAILED DESCRIPTION OF THE INVENTION

Technical Subject

An object of the present invention is to provide an electronic control device capable of compactly arranging a plurality of electronic components by improving the structure and capable of miniaturization.

Technical Solution

An electronic control device according to the present embodiment comprises: a housing; a first plate disposed in the housing; a second plate disposed in the housing and having an inner surface facing the inner surface of the first plate; a first control module disposed in the housing; and a second control module disposed in the housing, wherein the first control module includes: a first printed circuit board having an inner surface coupled to one side of the first plate and one side of the second plate; a first power supply substrate disposed on an outer surface of the second plate; and a first EMI filter disposed between the first plate and the second plate, an inner surface of which is opposite to an inner surface of the first printed circuit board, and wherein the second control module includes: a second printed circuit board having an inner surface coupled to the other side surface of the first plate and the other side surface of the second plate; a second power supply substrate disposed on an outer surface of the first plate; and a second EMI filter disposed between the first plate and the second plate, an inner surface thereof faces an inner surface of the second printed circuit board.

The first printed circuit board and the first power supply substrate are disposed perpendicular to each other, and the second printed circuit board and the second power supply substrate may be disposed perpendicular to each other.

A first pin is formed on one side surface of the first power supply substrate, a first pin hole to which the first pin is coupled is formed on the first printed circuit board, a second pin is formed on one side surface of the second power supply substrate, and a second pin hole to which the second pin is coupled may be formed on the second printed circuit board.

Both side surfaces of the first power supply substrate face inner surfaces of the first printed circuit board and the second printed circuit board, and both side surfaces of the second power supply substrate may face inner surfaces of the first printed circuit board and the second printed circuit board.

On an inner surface of the first plate, a first coupling part being protruded inwardly to which the first EMI filter is screw-coupled and a third coupling part to which the second EMI filter is screw-coupled are disposed; and on an inner surface of the second plate, a second coupling part being protruded inwardly to which the first EMI filter is screw-coupled and a fourth coupling part to which the second EMI filter is screw-coupled may be disposed.

The first printed circuit board is screw-coupled to one side surface of the first plate and the second plate, and the second printed circuit board may be screw-coupled to the first plate and the other side surface of the second plate.

A lower plate coupled to a lower surface of the housing is included, wherein the lower plate includes a first terminal and a second terminal facing each other with respect to the center, and wherein the first terminal may be coupled to the first power supply substrate, and the second terminal may be coupled to the second power supply substrate.

A first inductor is disposed on an inner surface of the first EMI filter, a second inductor is disposed on an inner surface of the second EMI filter, and the first inductor and the second inductor may be disposed to have a step difference in an up and down direction.

The first EMI filter includes a first bus bar being protruded to one side, the first power supply substrate includes a first coupling hole to which the first bus bar is coupled, the second EMI filter includes a second bus bar being protruded to one side, and the second power supply substrate may include a second coupling hole to which the second bus bar is coupled.

A first groove accommodating the second bus bar is disposed on a side surface of the second plate, and a second groove accommodating the first bus bar may be disposed on a side surface of the first plate.

Advantageous Effects

Through this embodiment, a plurality of control modules can be compactly coupled with respect to the bracket in a single housing, and there is an advantage in that the product is miniaturized.

In addition, since a connection structure through soldering is excluded between multiple electronic components, there is an advantage in that the manufacturing process is facilitated.

In addition, it has the advantage of not only compactly connecting the EMI filter and the power supply substrate disposed vertically through the busbar module, but also allowing the EMI filter to be firmly fixed inside the bracket.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
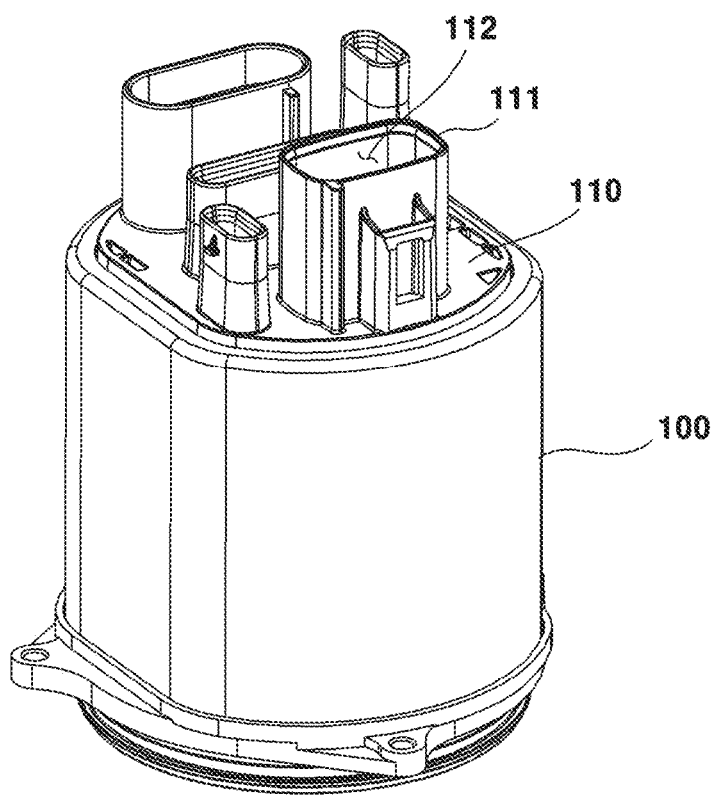
FIG. 1 is a perspective view illustrating an outer appearance of an electronic control device according to an embodiment of the present invention.
Figure 2:
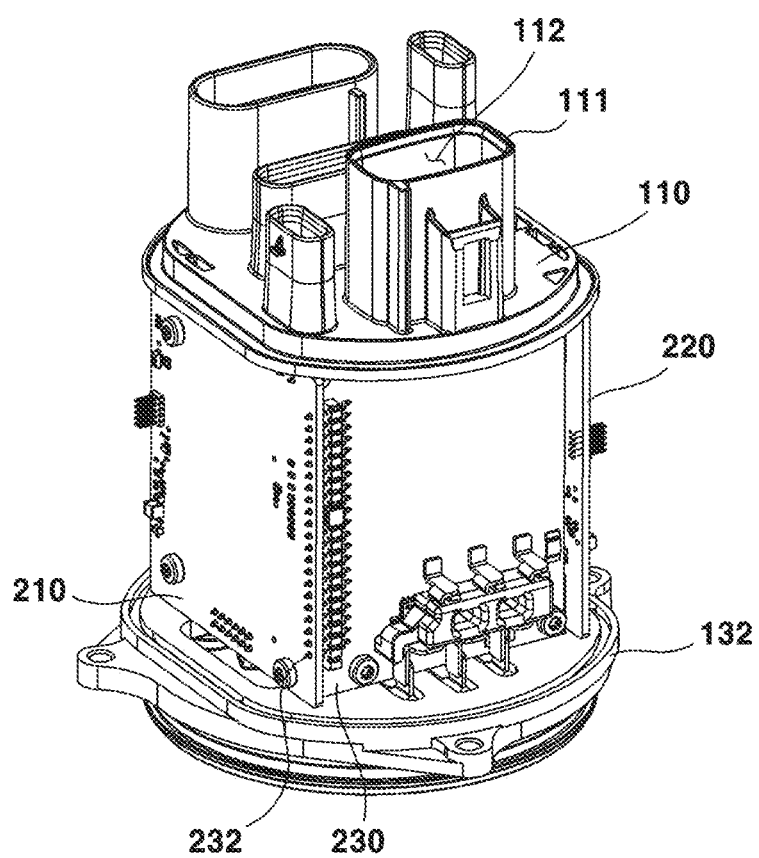
FIG. 2 is a perspective view illustrating FIG. 1 in which the housing is excluded.
Figure 3:
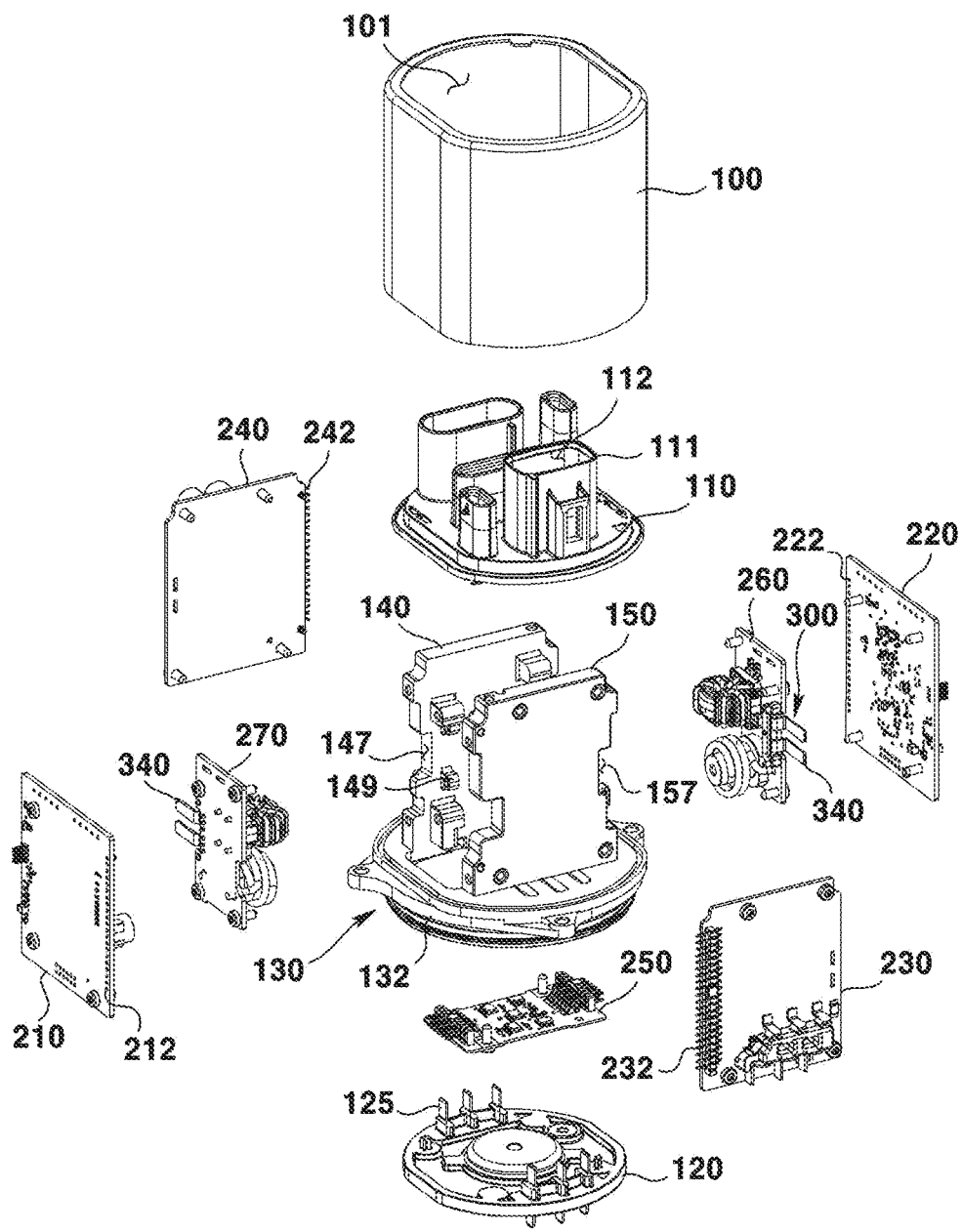
FIG. 3 is an exploded perspective view of an electronic control device according to an embodiment of the present invention.
Figure 4:
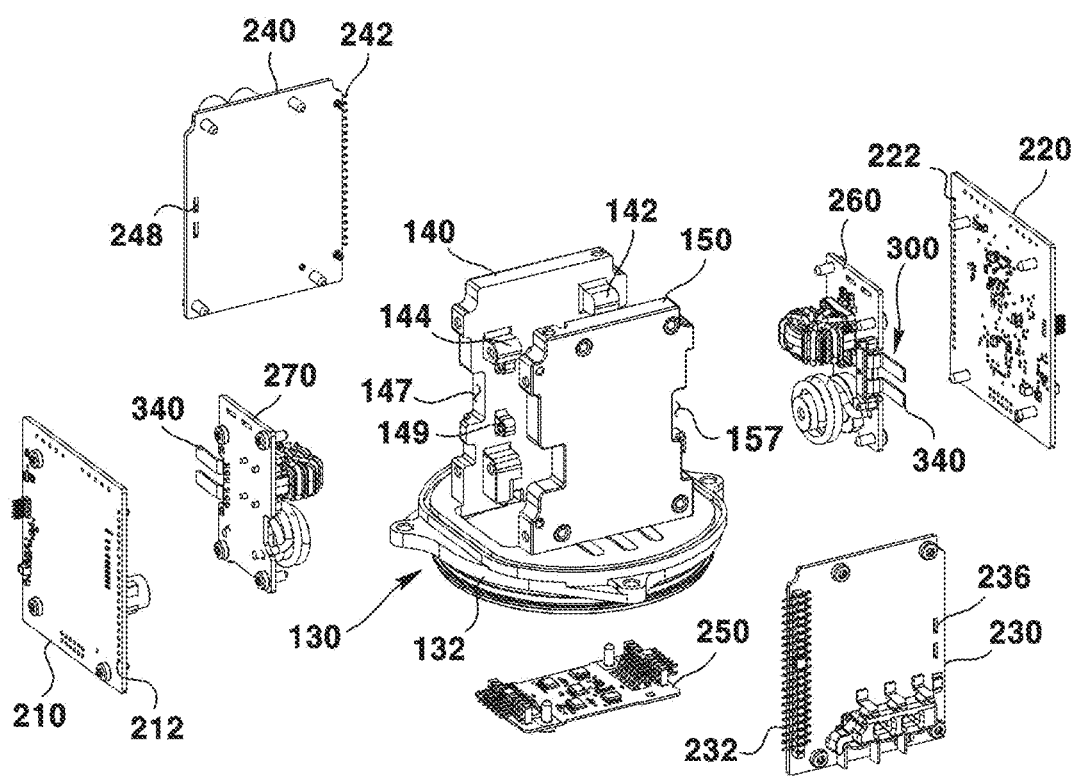
FIG. 4 is an enlarged view of a part of FIG. 3.
Figure 5:
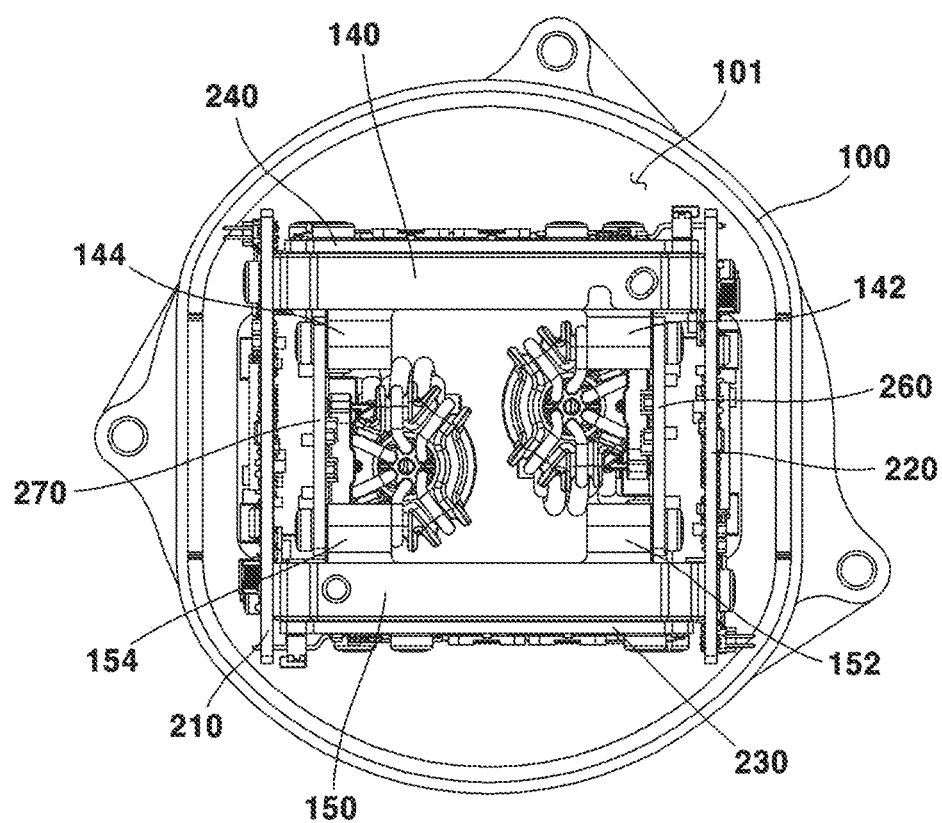
FIG. 5 is a plan view illustrating the inside of the housing according to an embodiment of the present invention.
Figure 6:
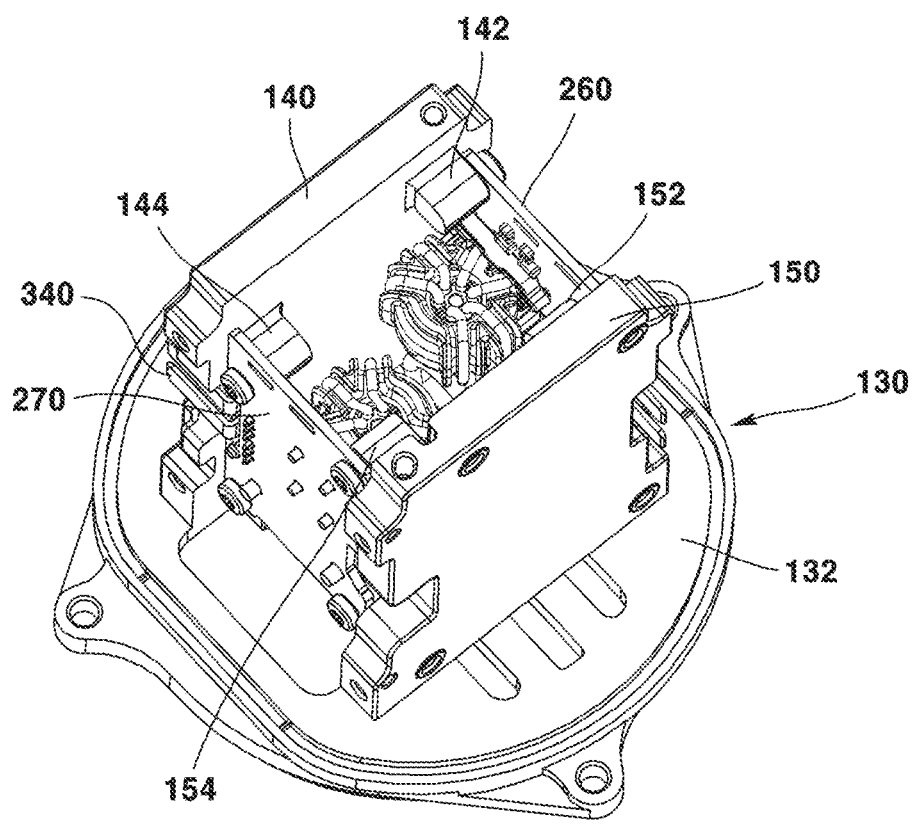
FIG. 6 is a perspective view illustrating a coupling structure of a bracket and a printed circuit board according to an embodiment of the present invention.
Figure 7:
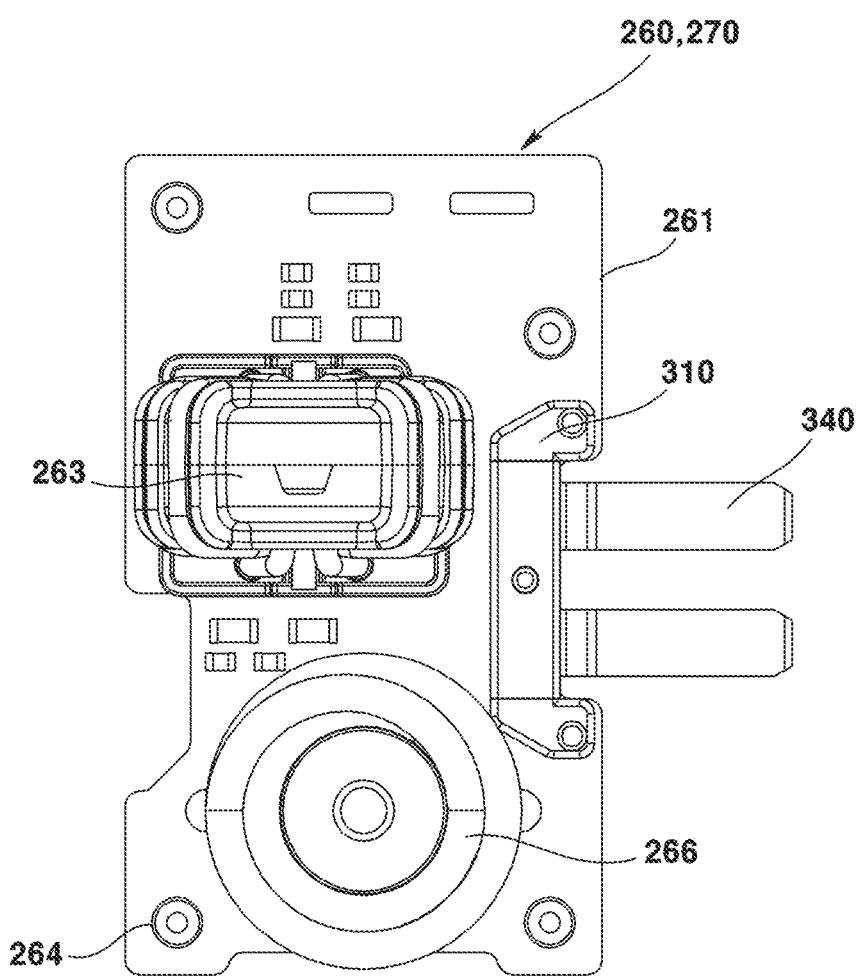
FIG. 7 is a plan view of an EMI filter according to an embodiment of the present invention.
Figure 8:
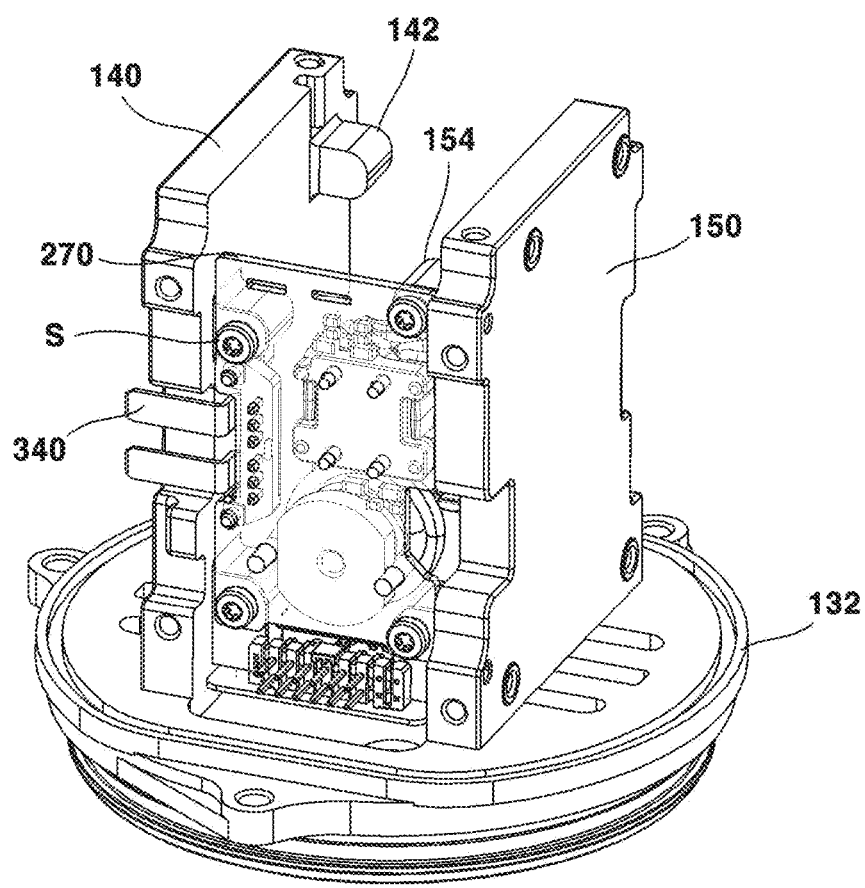
FIG. 8 is a perspective view illustrating a coupled state of a bracket and an EMI filter according to an embodiment of the present invention.

FIG. 1 is a perspective view illustrating an outer appearance of an electronic control device according to an embodiment of the present invention, FIG. 2 is a perspective view illustrating FIG. 1 in which the housing is excluded, FIG. 3 is an exploded perspective view of an electronic control device according to an embodiment of the present invention, FIG. 4 is an enlarged view of a part of FIG. 3, FIG. 5 is a plan view illustrating the inside of the housing according to an embodiment of the present invention, FIG. 6 is a perspective view illustrating a coupling structure of a bracket and a printed circuit board according to an embodiment of the present invention, FIG. 7 is a plan view of an EMI filter according to an embodiment of the present invention, and FIG. 8 is a perspective view illustrating a coupled state of a bracket and an EMI filter according to an embodiment of the present invention.

Referring to FIGS. 1 to 8, the outer shape of an electronic control device 10 according to an embodiment of the present invention, may be formed by the coupling of a housing 100, a first body 130, and a second body 110.

The housing 100 may be formed to have a circular or oval cross-section, and may have upper and lower surfaces open. The cross-sectional shape of the housing 100 may correspond to the cross-sectional shape of the motor. The material of the housing 100 may be plastic. A space may be formed inside the housing 100 so that electronic components for driving the electronic control device 10 are disposed.

The second body 110 may be coupled to cover the upper surface of the housing 100. A plurality of terminal coupling units 111 may be disposed on the second body 110. The terminal coupling unit 111 may be protruded upward from the upper surface of the second body 110, and a terminal groove 112 to which an external terminal is coupled may be formed therein. Each of the plurality of terminal coupling units 111 may have a different diameter of a terminal groove or a different height being protruded from the upper surface of the second body 110. When the external terminal is coupled to the terminal coupling unit 111, the internal configuration of the electronic control device 10 and the external terminal may be electrically connected. Accordingly, a signal for controlling the electronic control device 10 may be transmitted or received, or power may be provided to the electronic control device 10.

The second body 110 may include a base 132 and brackets 140 and 150 being protruded upward from the upper surface of the base 132 and disposed inside the housing 100. The brackets 140 and 150 and the base 132 may be formed as one body.

The base 132 may be coupled to cover the lower surface of the housing 100. Accordingly, the opening formed in the upper surface of the base 100 may be covered by the second body 110, and the opening formed in the lower surface of the base 100 may be covered by the base 132. The second body 110 and the base 132 may be coupled to the housing 100 through ribs and rib grooves. The second body 110 and the base 132 may be formed to have a cross-sectional shape corresponding to that of the housing 100.

A motor (not shown) may be coupled to a lower surface of the electronic control device 10. Accordingly, a lower plate 120 for coupling with the motor may be disposed on a lower surface of the base 132. A plurality of terminals 125 are disposed in the lower plate 120, the lower ends of the terminals 125 are electrically connected to the motor, and an upper end may pass through the base 132 to be electrically connected to the electronic control device 10.

A sealing member (not shown) for sealing may be additionally disposed between the lower plate 120 and the base 132. The terminal 125 may include a first terminal connected to a first control module, which will be described later, and a second terminal connected to a second control module. The first terminal and the second terminal may be disposed to face each other with respect to the center of the lower plate 120.

Meanwhile, an auxiliary substrate 250 is additionally disposed between the lower plate 120 and the base 132, and the auxiliary substrate 250 may be electrically connected to a first control module or a second control module, which will be described later.

A plurality of electronic components for driving the electronic control device 10 may be disposed in a space inside the housing 100. The plurality of electronic components may include a first control module and a second control module. The first control module and the second control module may be coupled to the brackets 140 and 150.

In detail, the brackets 140 and 150 are protruded upward from the upper surface of the base 132, and may be disposed inside the housing 100. The brackets 140 and 150 may include a first plate 140 and a second plate 150 disposed to face each other. The first plate 140 and the second plate 150 may have a predetermined thickness, and may support the first control module and the second control module. The first plate 140 and the second plate 150 may be disposed to be spaced apart from each other in the first direction. The first plate 140 and the second plate 150 may be disposed in parallel.

A first coupling part 142 being protruded inward may be disposed on the inner surface of the first plate 140. The first coupling part 142 may be disposed adjacent to one side of the inner surface of the first plate 140. A second coupling part 152 being protruded inward may be disposed on an inner surface of the second plate 150 facing the first plate 140. The second coupling part 152 may be disposed adjacent to one side of the inner surface of the second plate 150. The coupling part 142 and the second coupling part 152 are provided in plurality, respectively, and may be disposed to be spaced apart from each other in an up and down direction. The first coupling part 142 and the second coupling part 152 may have different heights in an up and down direction. For example, the second coupling part 152 may be disposed above the first coupling part 142.

A screw hole is formed in each of the first coupling part 142 and the second coupling part 152 to allow a screw S to penetrate therethrough, and a first EMI filter 260, which will be described later, may be screw-coupled thereto.

A third coupling part 144 being protruded inward may be disposed on the inner surface of the first plate 140. The third coupling part 144 may be disposed adjacent to the other side of the inner surface of the first plate 140. The third coupling part 144 may be disposed to have a step difference in an up and down direction from the first coupling part 142. For example, a length of the base 130 from the upper surface to the third coupling part 144 may be longer than that of the first coupling part 142. A fourth coupling part 154 being protruded inward may be disposed on an inner surface of the second plate 150 facing the first plate 140. The fourth coupling part 154 may be disposed adjacent to the other side of the inner surface of the second plate 150. The third coupling part 144 and the fourth coupling part 154 are provided in plurality, respectively, and may be disposed to be spaced apart from each other in an up and down direction. The third coupling part 144 and the fourth coupling part 154 may have different heights in an up and down direction. For example, the fourth coupling part 154 may be disposed above the third coupling part 144.

A screw hole is formed in each of the third coupling part 144 and the second coupling part 154 so that the screw S penetrating therethrough, and a second EMI filter 270 to be described later may be screw-coupled thereto.

On one side surface of the first plate 140, a second groove 147 being recessed further inwardly from the other region may be disposed. One side surface of the first plate 140 on which the second groove 147 is disposed may be a surface facing the first printed circuit board 210, which will be described later. A first bus bar 340 of a first EMI filter 260, which will be described later, may be disposed in the second groove 147.

A first groove 157 being recessed further inwardly than other regions may be disposed on one side surface of the second plate 140. One side surface of the second plate 150 on which the first groove 157 is disposed may be a surface facing the second printed circuit board 220, which will be described later. A second bus bar 340 of a second EMI filter 270, which will be described later, may be disposed in the first groove 157.

The first control module may include a first printed circuit board 210, a first power module substrate 230, and a first EMI filter 260. The first control module may be disposed to face the second control module with respect to the brackets 140 and 150.

The first printed circuit board 210 may be disposed on one side surface of the brackets 140 and 150. The first printed circuit board 210 may control the first power supply substrate 230. A plurality of elements for the operation of the first control module may be disposed in the first printed circuit board 210.

In detail, the inner surface of the first printed circuit board 210 may be disposed to face one side surface of the first plate 140 and one side surface of the second plate 150. The first printed circuit board 210 may be screw-coupled to one side surface of the first plate 140 and one side surface of the second plate. To this end, a screw may penetrate through the first printed circuit board 210 to be screw-coupled to one side surface of the first plate 140 and the second plate 150. A length of the first printed circuit board 210 in a first direction may be longer than a length from the outer surface of the first plate 140 to the outer surface of the second plate 150 in a first direction. Accordingly, both ends of the first printed circuit board 210 may be protruded outward from the first plate 140 and the second plate 150. The lower end of the first printed circuit board 210 may be in contact with the upper surface of the base 132, and the lower surface may be in contact with the lower surface of the second body 110.

The first power supply substrate 230 may be disposed on an outer surface of the second plate 150. The first power supply substrate 230 may be electrically connected to the first printed circuit board 210. The first power supply substrate 230 is for controlling a large current, and may be electrically connected to the motor. The first terminal 125 in the lower plate 120 may penetrate through the base 132 to be coupled to the first power supply substrate 230.

The first power supply substrate 230 may be vertically disposed in the first printed circuit board 210. A plurality of pins 232 may be formed on one side surface of the first power supply substrate 230, and pinholes 212 may be formed in the first printed circuit board 210 to couple the pins 232 to each other. By coupling the pin 232 and the pinhole 212, the first power supply substrate 230 may be electrically connected to the first printed circuit board 210. Both side surfaces of the first power supply substrate 230 may be supported by the inner surface of the first printed circuit board 210 and the inner surface of the second printed circuit board 220, which will be described later. The first power supply substrate 230 may be screw-coupled to an outer surface of the second plate 150.

The first EMI filter 260 may be disposed inside a second printed circuit board 220, which will be described later. The first EMI filter 260 may be disposed to face the inner surface of the first printed circuit board 210. The first EMI filter 260 may be disposed to face the inner surface of the second printed circuit board 220.

The first EMI filter 260 may be screw-coupled to the first coupling part 142 and the second coupling part 152. Both side surfaces of the first EMI filter 260 may be disposed to face inner surfaces of the first plate 140 and the second plate 150. Both side surfaces of the first EMI filter 260 may be in contact with inner surfaces of the first plate 140 and the second plate 150.

The first EMI filter 260 may include a first bus bar 340 being protruded outward from one side surface. The first bus bar 340 may be formed of a metal material. A first coupling hole 236 may be disposed in the first power supply substrate 230 so that the first bus bar 340 penetrates therethrough. Accordingly, the first EMI filter 260 and the first power supply substrate 230 may be electrically connected to each other by coupling the first bus bar 340 and the first coupling hole 236. The first bus bar 340 may be accommodated in the first groove 157.

The second control module may include a second printed circuit board 220, a second power module substrate 240, and a second EMI filter 270. The second control module may be disposed to face the first control module with respect to the brackets 140 and 150.

The second printed circuit board 220 may be disposed on the other side surface of the brackets 140 and 150. The second printed circuit board 220 may control the second power supply substrate 240. A plurality of devices for the operation of the second control module may be disposed in the second printed circuit board 220. The second printed circuit board 220 may be disposed to face the first printed circuit board 210.

In detail, an inner surface of the second printed circuit board 220 may be disposed to face the other side surface of the second plate 150 and the other side surface of the second plate 150. The second printed circuit board 220 may be screw-coupled to the other side surface of the first plate 140 and the other side surface of the second plate 150. To this end, a screw may penetrate through the second printed circuit board 220 to be screw-coupled to the other side surfaces of the first plate 140 and the second plate 150. A length of the second printed circuit board 220 in a first direction may be longer than a length from the outer surface of the first plate 140 to the outer surface of the second plate 150 in the first direction. Accordingly, both ends of the second printed circuit board 220 may be protruded outward from the first plate 140 and the second plate 150. A lower end of the second printed circuit board 220 may be in contact with an upper surface of the base 132, and a lower surface may be in contact with a lower surface of the second body 110.

The second power supply substrate 240 may be disposed on an outer surface of the first plate 140. The second power supply substrate 240 may be disposed to face the first power supply substrate 220. The second power supply substrate 240 may be electrically connected to the second printed circuit board 220. The second power supply substrate 240 is for controlling a large current, and may be electrically connected to the motor. The second terminal 125 in the lower plate 120 may penetrate through the base 132 to be coupled to the second power supply substrate 240.

The second power supply substrate 240 may be vertically disposed in the second printed circuit board 220. A plurality of pins 242 may be formed on one side surface of the second power supply substrate 240, and pinholes 222 may be formed in the second printed circuit board 220 to couple the pins 242 to each other. By coupling the pin 242 and the pinhole 222, the second power supply substrate 240 may be electrically connected to the second printed circuit board 220. Both side surfaces of the second power supply substrate 240 may be supported by the inner surface of the second printed circuit board 220 and the inner surface of the first printed circuit board 210. The second power supply substrate 240 may be screw-coupled to the outer surface of the first plate 140.

The second EMI filter 270 may be disposed at an inner side of the first printed circuit board 220. The second EMI filter 270 may be disposed to face the first EMI filter 270. The second EMI filter 270 may be disposed to face an inner surface of the second printed circuit board 220. The second EMI filter 270 may be disposed to face an inner surface of the first printed circuit board 210.

The second EMI filter 270 may be screw-coupled to the third coupling part 144 and the fourth coupling part 154. Both side surfaces of the second EMI filter 270 may be disposed to face inner surfaces of the first plate 140 and the second plate 150. Both side surfaces of the second EMI filter 270 may be in contact with inner surfaces of the first plate 140 and the second plate 150.

The second EMI filter 270 may include a second bus bar 340 being protruded outward from one side surface. The second bus bar 340 may be formed of a metal material. A second coupling hole 248 may be disposed in the second power supply substrate 240 to allow the second bus bar 340 to penetrate therethrough. Accordingly, the second EMI filter 270 and the second power supply substrate 240 may be electrically connected to each other by coupling the second bus bar 340 and the second coupling hole 248.

The first EMI filter 260 and the second EMI filter 270 may include a plate-shaped substrate 261, a CM inductor 263, and a DM inductor 266, respectively. The DM inductor 266 may be disposed below the CM inductor 263. The DM inductor 266 and the CM inductor 263 may be respectively disposed on the inner surface of the substrate 251. The DM inductor disposed in the first EMI filter 260 and the DM inductor disposed in the second EMI filter 270 may be disposed to be stepped in an up and down direction. The CM inductor disposed in the first EMI filter 260 and the CM inductor disposed in the second EMI filter 270 may be disposed to be stepped in an up and down direction. The CM inductor 263 and the DM inductor 266 in the EMI filters 260 and 270 convert the input current and may deliver it to the first power supply substrate 220 and the second power supply substrate 240 through the bus bar 340, respectively.

According to the structure as described above, a plurality of control modules can be compactly combined with respect to the bracket in a single housing, and there is an advantage in that the product is miniaturized.

In addition, since a connection structure through soldering is excluded between a plurality of electronic components, there is an advantage in that the manufacturing process is facilitated.

Hereinafter, a bus bar module electrically connecting the first EMI filter 260 and the first power supply substrate 230 and the second EMI filter 270 and the second power supply substrate 240 will be described.

Figure 9:
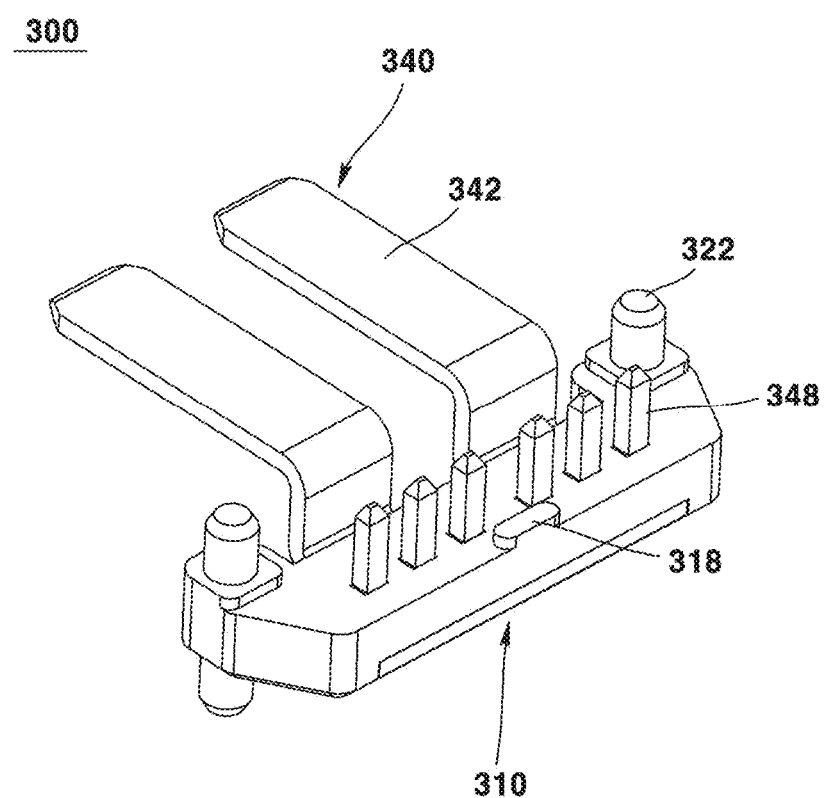
FIG. 9 is a perspective view of a busbar module according to an embodiment of the present invention.
Figure 10:
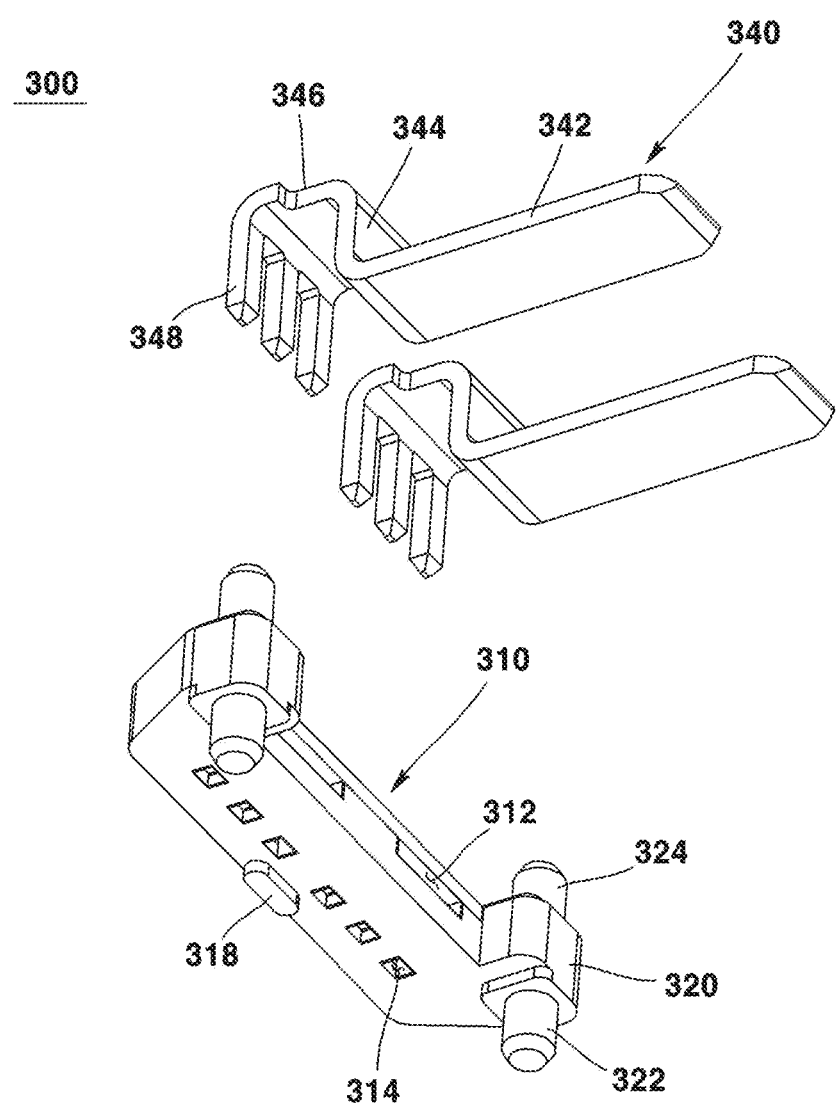
FIG. 10 is an exploded perspective view of a busbar module according to an embodiment of the present invention.
Figure 11:
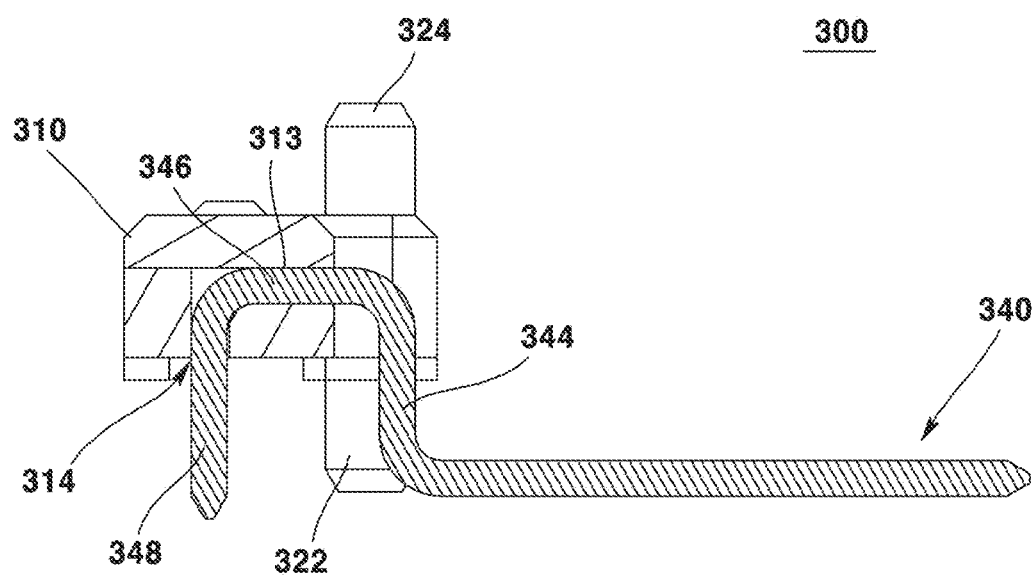
FIG. 11 is a cross-sectional view illustrating a coupled state between a bus bar and a body in a bus bar module according to an embodiment of the present invention.

FIG. 9 is a perspective view of a busbar module according to an embodiment of the present invention, FIG. 10 is an exploded perspective view of a busbar module according to an embodiment of the present invention, and FIG. 11 is a cross-sectional view illustrating a coupled state between a bus bar and a body in a bus bar module according to an embodiment of the present invention.

Referring to FIGS. 1 to 11, the first EMI filter 260 and the first power supply substrate 230, the second EMI filter 270 and the second power supply substrate 240 may be electrically connected to each other via a busbar module 300. The bus bar module 300 may be disposed on a substrate 261 (refer to FIG. 7) forming an outer shape of the first EMI filter 260 and the second EMI filter 270.

In detail, the bus bar module 300 may include: a bus bar 340 having one end coupled to the substrate 261 and the other end coupled to the first power supply substrate 230 or the second power supply substrate 240; and a body 310 for coupling the bus bar 340 to the substrate 261. The body 310 is formed of a plastic material and may be called a bracket in that the bus bar 340 is supported on the substrate 261.

The body 310 may have an inner surface coupled to the brackets 140 and 150, and an outer surface coupled to the substrate 261. A first through hole 314 penetrating the bus bar 340 may be formed on an outer surface of the body 310 facing the substrate 261. In addition, a second through hole 312 may be formed on a side surface of the body 310 facing the first power supply substrate 230 or the second power supply substrate 240. At an inner side of the body 310, a space 313, whose both ends are defined by the first through-hole 314 and the second through-hole 312, for accommodating at least a part of the bus bar 340 may be formed. Accordingly, at least a portion of the bus bar 340 is disposed in the space 313, and the bus bar 340 may be firmly fixed inside the body 310.

A first protrusion 322 being protruded outward from other regions may be disposed on the outer surface of the body 310. A second protrusion 324 being protruded outward from other regions may be disposed on the inner surface of the body 310. The first protrusion 322 and the second protrusion 324 may be disposed to be overlapped in an up and down direction. The first protrusion 322 and the second protrusion 324 may have a circular cross-sectional shape. The body 310 may include an extension portion 320 that is protruded outwardly from other regions so that the first protrusion 322 is disposed on an outer surface and the second protrusion 324 is disposed on an inner surface.

On the other hand, the first protrusion 322 and the second protrusion 324 may be formed as a single shaft and coupled to the body 310, and in this case, the extension portion 320 may include a hole penetrating through the outer surface from the inner surface so that the single shaft is coupled.

The substrate 261 may include a coupling hole to which the first protrusion 322 is coupled. The coupling hole may have a hole shape penetrating through the inner surface from the outer surface so that the first protrusion 322 is coupled. When the bus bar module 300 is coupled to the EMI filters 260 and 270, the first protrusion 322 may be coupled to the coupling hole.

Meanwhile, a protruded part 318 being protruded to the outer side may be additionally provided on an outer surface of the body 310, and in this case, the protruded part 318 may be disposed to be facing the first protrusion 322 with respect to the first through hole 314. In addition, an additional coupling hole may be disposed in the substrate 261 to be coupled to the protruded part 318. Accordingly, the protruded part 318 and the first protrusion 322 are coupled to the coupling holes, so that the body 310 and the substrate 261 may be coupled to each other.

The first protrusion 322 and the coupling hole may be provided in plurality and disposed to correspond to each other. Cross-sectional shapes of the protruded part 318 and the first protrusion 322 may be different from each other. At this time, the protruded part 318 may be disposed to face a central region of an imaginary line connecting the plurality of first protrusions 322 and the first through hole 314 as a reference.

The second protrusion 324 may be coupled to the brackets 140 and 150. A body coupling part 149 to which the second protrusion 324 is coupled may be formed on the inner surfaces of the first plate 140 and the second plate 150 to be protruded further toward the inner side than other regions. A hole is disposed on a side surface of the body coupling part 149 to correspond to a cross-sectional shape of the second protrusion 324, and the second protrusion 324 may be coupled to the hole. Accordingly, the first and second EMI filters 260 and 270 can be firmly fixed to the brackets 140 and 150 by coupling the second protrusion 324 and the body coupling part 149, in addition to coupling through coupling parts 142 and 144.

The bus bar 340 may include a first terminal 342 disposed to be protruded outward from the side surface of the body 310 and a second terminal 348 disposed to be protruded outward from the outer surface of the body 310. The first terminal 342 may be coupled to the first power supply substrate 230 or the second power supply substrate 240. The second terminal 348 may be coupled to the substrate 261. The second terminal 348 may be formed in a pin shape to be coupled to a terminal hole (not shown) of the substrate 261. The second terminal 348 may be formed by a combination of a plurality of pins.

The bus bar 340 may have a region bent at least once. At least a portion of a region between the first terminal 342 and the second terminal 348 may be disposed in the space 313 inside the body 310.

In detail, the bus bar 340 may include a first bent part 344 bent inward from one end of the first terminal 342 and a second bent part 346 that connects the first bent part 344 and the second terminal 348 and is bent from the extended end of the first bent part 344. The first bent part 344 may be disposed parallel to the second terminal 348, and the second bent part 346 may be disposed parallel to the first terminal 342. The first bent part 344 and the second terminal 348 may be perpendicular to the second bent part 346 and the first terminal 342. An inner surface of the first bent part 344 may be in contact with one side surface of the body 310. As described above, the first terminal 342 may be coupled to the grooves 147 and 157 of the first plate 140 and the second plate 150.

According to the above structure, there is an advantage in that the EMI filter and the power supply substrate, which are disposed perpendicularly to each other through the busbar module, can be connected compactly, and the EMI filter can be firmly fixed in the bracket as well.

In the above, even though all the components constituting the embodiments of the present invention are described as being combined into one or operating in combination, the present invention is not necessarily limited to these embodiments. That is, within the scope of the object of the present invention, all the constituent elements may be selectively combined and operated in one or more. In addition, the terms 'include', 'consist of', or 'have' described above mean that the corresponding component can be present unless otherwise stated, so other components are excluded. Rather, it should be interpreted as being able to further include other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and are not interpreted as ideal or excessively formal meanings unless explicitly defined in the present invention.

The above description is merely illustrative of the technical idea of the present invention, and those of ordinary skill in the art to which the present invention pertains will be able to make various modifications and variations without departing from the essential characteristics of the present invention. Accordingly, the embodiments disclosed in the present invention are not intended to limit the technical idea of the present invention, but to explain the technical idea, and the scope of the technical idea of the present invention is not limited by these embodiments. The scope of protection of the present invention should be interpreted by the following claims, and all technical ideas.

The invention claimed is:

1. An electronic control device comprising:
   a housing;
   a first plate disposed in the housing;
   a second plate disposed in the housing and having an inner surface facing an inner surface of the first plate;
   a first control module disposed in the housing; and
   a second control module disposed in the housing,
   wherein the first control module includes:
   a first printed circuit board having an inner surface coupled to one side surface of the first plate and one side surface of the second plate;
   a first power supply substrate disposed on an outer surface of the second plate; and
   a first EMI filter disposed between the first plate and the second plate, an outer surface of which is opposite to the inner surface of the first printed circuit board, and
   wherein the second control module includes:
   a second printed circuit board having an inner surface coupled to an other side surface of the first plate and an other side surface of the second plate;
   a second power supply substrate disposed on an outer surface of the first plate; and
   a second EMI filter disposed between the first plate and the second plate, an outer surface thereof facing the inner surface of the second printed circuit board,
   wherein a first pin is formed on one side surface of the first power supply substrate,
   wherein a first pin hole to which the first pin is coupled is formed on the first printed circuit board,
   wherein a second pin is formed on one side surface of the second power supply substrate, and
   wherein a second pin hole to which the second pin is coupled is formed on the second printed circuit board.

2. The electronic control device according to claim 1, wherein the first printed circuit board and the first power supply substrate are disposed perpendicular to each other, and
   wherein the second printed circuit board and the second power supply substrate are disposed perpendicular to each other.

3. The electronic control device according to claim 2, wherein the first printed circuit board is disposed parallel to the first EMI filter, and
   wherein the second printed circuit board is disposed parallel to the second EMI filter.

4. The electronic control device according to claim 1, wherein both side surfaces of the first power supply substrate face the inner surfaces of the first printed circuit board and the second printed circuit board, and
   wherein both side surfaces of the second power supply substrate face the inner surfaces of the first printed circuit board and the second printed circuit board.

5. The electronic control device according to claim 1, wherein, on the inner surface of the first plate, a first coupling part is protruded inwardly to which the first EMI filter is screw-coupled and a third coupling part to which the second EMI filter is screw-coupled are disposed, and
   wherein, on an inner surface of the second plate, a second coupling part is protruded inwardly to which the first EMI filter is screw-coupled and a fourth coupling part to which the second EMI filter is screw-coupled are disposed.

6. The electronic control device according to claim 1, wherein the first printed circuit board is screw-coupled to the one side surface of the first plate and the second plate, and
   wherein the second printed circuit board is screw-coupled to the first plate and the other side surface of the second plate.

7. The electronic control device according to claim 1, wherein a lower plate coupled to a lower surface of the housing is included,
   wherein the lower plate includes a first terminal and a second terminal facing each other with respect to a center,
   wherein the first terminal is coupled to the first power supply substrate, and
   wherein the second terminal is coupled to the second power supply substrate.

8. The electronic control device according to claim 1, wherein a first inductor is disposed on an inner surface of the first EMI filter,
   wherein a second inductor is disposed on an inner surface of the second EMI filter, and
   wherein the first inductor and the second inductor are disposed to have a step difference in an up and down direction.

9. The electronic control device according to claim 1, wherein the first EMI filter includes a first bus bar protruded to one side,
   wherein the first power supply substrate includes a first coupling hole to which the first bus bar is coupled,
   wherein the second EMI filter includes a second bus bar protruded to one side, and
   wherein the second power supply substrate includes a second coupling hole to which the second bus bar is coupled.

10. The electronic control device according to claim 9, wherein a first groove accommodating the second bus bar is disposed on the side surface of the second plate, and
wherein a second groove accommodating the first bus bar is disposed on the side surface of the first plate.

11. The electronic control device according to claim 5, wherein the second coupling part is disposed above the first coupling part.

12. The electronic control device according to claim 1, wherein the fourth coupling part is disposed above the third coupling part.

13. The electronic control device according to claim 1, wherein the housing has open upper and lower surfaces, and wherein a first body is coupled to the lower surface of the housing, and a second body is coupled to the upper surface of the housing.

14. The electronic control device according to claim 1, wherein an upper end of the first printed circuit board and an upper end of the second printed circuit board are in contact with a lower surface of a second body, respectively, and
wherein a lower end of the first printed circuit board and a lower end of the second printed circuit board are in contact with an upper surface of a first body.

15. The electronic control device according to claim 1, wherein a length of the first printed circuit board or the second printed circuit board in a first direction is greater than a length from the outer surface of the first plate to the outer surface of the second plate in the first direction.

16. An electronic control device comprising:
a housing;
a first plate disposed in the housing;
a second plate disposed in the housing and having an inner surface facing an inner surface of the first plate; and
a first control module disposed in the housing,
wherein the first control module includes:
a first printed circuit board having an inner surface coupled to one side of the first plate and one side of the second plate;
a first power supply substrate disposed on an outer surface of the second plate; and
a first EMI filter disposed between the first plate and the second plate, an outer surface of which is opposite to the inner surface of the first printed circuit board,
wherein the first EMI filter includes a substrate and a bus bar module disposed on an inner surface of the substrate to electrically connect the first power substrate and the substrate, and wherein the bus bar module includes a bracket disposed on the inner surface of the substrate, and a bus bar having at least a portion accommodated in a space within the bracket, one end coupled to the first power supply substrate, and an other end coupled to the substrate.

17. The electronic control device according to claim 16, wherein the first printed circuit board and the first power supply substrate are disposed perpendicular to each other, and
wherein the first EMI filter is disposed on the first power supply substrate.

18. The electronic control device according to claim 16, wherein a first through hole opening the space is disposed on an outer surface of the bracket, and
wherein a second through hole opening the space is disposed on a side surface of the bracket.

19. The electronic control device according to claim 16, wherein a first protrusion protruding outward is disposed on an outer surface of the bracket, and
wherein a first coupling hole is disposed on the substrate to couple the first protrusion.

20. The electronic control device according to claim 19, wherein a protrusion is disposed on the outer surface of the bracket,
wherein a second coupling hole is disposed on the substrate to couple the protrusion, and wherein cross-sectional shapes of the protrusion and the first protrusion are different.

* * * * *